US006915592B2

(12) United States Patent
Guenther (10) Patent No.: US 6,915,592 B2
(45) Date of Patent: Jul. 12, 2005

(54) METHOD AND APPARATUS FOR GENERATING GAS TO A PROCESSING CHAMBER

(75) Inventor: Rolf A. Guenther, Monte Sereno, CA (US)

(73) Assignee: Applied Materials, Inc., Santa Clara, CA (US)

( * ) Notice: Subject to any disclaimer, the term of this patent is extended or adjusted under 35 U.S.C. 154(b) by 280 days.

(21) Appl. No.: 10/208,305

(22) Filed: Jul. 29, 2002

(65) Prior Publication Data

US 2004/0025370 A1 Feb. 12, 2004

(51) Int. Cl.[7] .......................... F26B 25/00; C23C 16/00
(52) U.S. Cl. ....................... 34/582; 118/715; 427/248.1
(58) Field of Search ........................ 34/359–361, 364, 34/493, 576, 582, 72, 92; 156/345.29, 345.37; 118/715, 726; 427/248.1, 255.23

(56) References Cited

U.S. PATENT DOCUMENTS

| | | | |
|---|---|---|---|
| 4,058,430 A | 11/1977 | Suntola et al. ............... 156/611 |
| 4,324,285 A | 4/1982 | Henderson ....................... 165/2 |
| 4,389,973 A | 6/1983 | Suntola et al. ............... 118/725 |
| 4,413,022 A | 11/1983 | Suntola et al. ........... 427/255.2 |
| 4,579,699 A | 4/1986 | Verzemnieks ................. 264/43 |
| 4,588,449 A | 5/1986 | Sigler ........................ 148/6.35 |
| 4,596,506 A | 6/1986 | Burgardt et al. ............. 414/426 |
| 4,605,566 A | 8/1986 | Matsui et al. ............... 427/43.1 |
| 4,686,116 A | 8/1987 | Rickborn et al. ............ 427/215 |
| 4,712,600 A | 12/1987 | Hamajima et al. ............ 164/97 |
| 4,752,504 A | 6/1988 | Rickborn ..................... 427/249 |
| 4,817,557 A | 4/1989 | Diem et al. .................. 118/719 |
| 4,834,831 A | 5/1989 | Nishizawa et al. .......... 156/611 |
| 4,993,357 A | 2/1991 | Scholz ........................ 118/715 |
| 5,039,392 A | 8/1991 | Bearden, Jr. et al. ....... 208/112 |
| 5,053,376 A | 10/1991 | Bearden, Jr. et al. ....... 502/150 |
| 5,055,436 A | 10/1991 | Klemptner et al. .......... 501/152 |
| 5,122,505 A | 6/1992 | Gusman et al. ................. 505/1 |
| 5,225,366 A | 7/1993 | Yoder .......................... 437/108 |
| 5,281,274 A | 1/1994 | Yoder .......................... 118/697 |

(Continued)

FOREIGN PATENT DOCUMENTS

| | | | |
|---|---|---|---|
| EP | 1 167 569 | 1/2002 | ......... C23C/16/455 |
| GB | 2 355 727 | 5/2001 | ........... C23C/16/44 |
| JP | 58098917 | 6/1983 | ............. H03J/7/02 |

(Continued)

OTHER PUBLICATIONS

US 2002/0008570,, 8/2002, Lindfors (withdrawn)

Hummel, et al., Abstract of "Characteristics of GaAs, AlGaAs, and InGaAs Materials Grown by Metalorganic Chemical Vapor Deposition Using an On–Demand Hydride Gas Generator", Applied Physics Letter, vol. 60, No. 12, pp. 1483–1485, Mar. 23, 1992.

(Continued)

*Primary Examiner*—Evan Pert
(74) *Attorney, Agent, or Firm*—Moser, Patterson & Sheridan LLP (57) ABSTRACT

A method and apparatus for generating gas for a processing system is provided. In one embodiment, an apparatus for generating gas for a processing system includes an unitary, isolatable, transportable canister having a plurality of first spacing elements, a plurality of second spacing elements and a solid material disposed within the canister. The spacing elements have different mean diameters. The solid material is adapted to produce a gas vapor when exposed to a temperature above a predetermined level at a predetermined pressure. In another embodiment, an apparatus for generating gas includes a gas source coupled to a processing chamber by a first gas line. A canister is coupled in-line with the first gas line and contains a solid material that produces a process gas when heated. A heater is disposed between the gas source and the canister to heat gas flowing into the canister.

63 Claims, 5 Drawing Sheets

U.S. PATENT DOCUMENTS

| | | | |
|---|---|---|---|
| 5,294,286 A | 3/1994 | Nishizawa et al. | 156/610 |
| 5,316,619 A | 5/1994 | Mastrangelo | 156/644 |
| 5,321,260 A | 6/1994 | Goldstein et al. | 250/251 |
| 5,369,544 A | 11/1994 | Mastrangelo | 361/283.4 |
| 5,374,570 A | 12/1994 | Nasu et al. | 437/40 |
| 5,377,429 A * | 1/1995 | Sandhu et al. | 34/586 |
| 5,409,569 A | 4/1995 | Seki et al. | 156/662 |
| 5,441,703 A | 8/1995 | Jurgensen | 422/129 |
| 5,443,647 A | 8/1995 | Aucoin et al. | 118/723 |
| 5,470,797 A | 11/1995 | Mastrangelo | 437/225 |
| 5,480,818 A | 1/1996 | Matsumoto et al. | 437/40 |
| 5,483,919 A | 1/1996 | Yokoyama et al. | 117/89 |
| 5,502,092 A | 3/1996 | Barrows et al. | 521/64 |
| 5,503,875 A | 4/1996 | Imai et al. | 427/255.3 |
| 5,668,188 A | 9/1997 | Whinnery et al. | 423/345 |
| 5,674,574 A | 10/1997 | Atwell et al. | 427/561 |
| 5,674,786 A | 10/1997 | Turner et al. | 437/225 |
| 5,700,379 A | 12/1997 | Biebl | 216/2 |
| 5,711,811 A | 1/1998 | Suntola et al. | 118/711 |
| 5,770,018 A | 6/1998 | Saidi | 204/157.15 |
| 5,796,116 A | 8/1998 | Nakata et al. | 257/66 |
| 5,807,792 A | 9/1998 | Ilg et al. | 438/758 |
| 5,820,680 A | 10/1998 | Miyamoto et al. | 118/723 EB |
| 5,835,677 A | 11/1998 | Li et al. | 392/401 |
| 5,855,680 A | 1/1999 | Soininen et al. | 118/719 |
| 5,879,459 A | 3/1999 | Gadgli et al. | 118/715 |
| 5,904,771 A | 5/1999 | Tasaki et al. | 117/105 |
| 5,916,365 A | 6/1999 | Sherman | 117/92 |
| 5,923,056 A | 7/1999 | Lee et al. | 257/192 |
| 5,976,489 A | 11/1999 | Saidi et al. | 423/599 |
| 6,015,590 A | 1/2000 | Suntola et al. | 427/255.23 |
| 6,015,917 A | 1/2000 | Bhandari et al. | 556/12 |
| 6,042,652 A | 3/2000 | Hyun et al. | 118/719 |
| 6,084,302 A | 7/2000 | Sandhu | 257/751 |
| 6,107,198 A | 8/2000 | Lin et al. | 438/680 |
| 6,110,814 A | 8/2000 | Tokumasu et al. | 438/597 |
| 6,124,158 A | 9/2000 | Dautartas et al. | 438/216 |
| 6,139,700 A | 10/2000 | Kang et al. | 204/192.17 |
| 6,144,060 A | 11/2000 | Park et al. | 257/310 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,207,487 B1 | 3/2001 | Kim et al. | 438/238 |
| 6,231,672 B1 | 5/2001 | Choi et al. | 118/715 |
| 6,248,434 B1 | 6/2001 | Rodiger et al. | 428/307.7 |
| 6,261,679 B1 | 7/2001 | Chen et al. | 428/317.9 |
| 6,265,026 B1 | 7/2001 | Wang | 427/248.1 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,290,864 B1 | 9/2001 | Patel et al. | 216/79 |
| 6,305,314 B1 | 10/2001 | Sneh et al. | 118/723 |
| 6,306,216 B1 | 10/2001 | Kim et al. | 118/725 |
| 6,342,277 B1 | 1/2002 | Sherman | 427/562 |
| 6,348,376 B2 | 2/2002 | Lim et al. | 438/253 |
| 6,348,386 B1 | 2/2002 | Gilmer | 438/288 |
| 6,358,829 B2 | 3/2002 | Yoon et al. | 438/597 |
| 6,365,231 B2 | 4/2002 | Sato et al. | 427/255.39 |
| 6,372,598 B2 | 4/2002 | Kang et al. | 438/399 |
| 6,379,748 B1 | 4/2002 | Bhandari et al. | 427/255.394 |
| 6,391,785 B1 | 5/2002 | Satta et al. | 437/704 |
| 6,399,491 B2 | 6/2002 | Jeon et al. | 438/680 |
| 6,416,577 B1 | 7/2002 | Suntola et al. | 117/88 |
| 6,416,822 B1 | 7/2002 | Chiang et al. | 427/561 |
| 6,428,859 B1 | 8/2002 | Chiang et al. | 427/457 |
| 6,447,607 B2 | 9/2002 | Soininen et al. | 117/200 |
| 6,451,119 B2 | 9/2002 | Sneh et al. | 118/715 |
| 6,451,695 B2 | 9/2002 | Sneh | 438/685 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | 117/88 |
| 6,481,945 B1 | 11/2002 | Hasper et al. | 414/217 |
| 6,482,262 B1 | 11/2002 | Elers et al. | 117/84 |
| 6,482,733 B2 | 11/2002 | Raaijmakers et al. | 438/633 |
| 6,511,539 B1 | 1/2003 | Raaijmakers | 117/102 |
| 6,551,406 B2 | 4/2003 | Kilpi | 118/728 |
| 2001/0000866 A1 | 5/2001 | Sneh et al. | 118/723 |
| 2001/0002280 A1 | 5/2001 | Sneh | 427/255.28 |
| 2001/0008115 A1 | 7/2001 | Kawase et al. | 117/13 |
| 2001/0009140 A1 | 7/2001 | Bondestan et al. | 118/725 |
| 2001/0009695 A1 | 7/2001 | Saanila et al. | 427/255.39 |
| 2001/0011526 A1 | 8/2001 | Doering et al. | 118/729 |
| 2001/0013312 A1 | 8/2001 | Soininen et al. | 117/86 |
| 2001/0014371 A1 | 8/2001 | Kilpi | 427/255.28 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0042799 A1 | 11/2001 | Kim et al. | 239/553 |
| 2001/0048973 A1 | 12/2001 | Sato et al. | 427/255.39 |
| 2001/0054377 A1 | 12/2001 | Lindfors et al. | 117/104 |
| 2001/0054730 A1 | 12/2001 | Kim et al. | 257/301 |
| 2001/0054769 A1 | 12/2001 | Raaijmakers et al. | 257/758 |
| 2002/0000196 A1 | 1/2002 | Park | 118/715 |
| 2002/0000598 A1 | 1/2002 | Kang et al. | 257/301 |
| 2002/0007790 A1 | 1/2002 | Park | 118/715 |
| 2002/0009544 A1 | 1/2002 | McFeely et al. | 427/248.1 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/569 |
| 2002/0033229 A1 | 3/2002 | Lebouitz et al. | 156/345 |
| 2002/0041931 A1 | 4/2002 | Suntola et al. | 427/255.28 |
| 2002/0048635 A1 | 4/2002 | Kim et al. | 427/331 |
| 2002/0052097 A1 | 5/2002 | Park | 438/507 |
| 2002/0066411 A1 | 6/2002 | Chiang et al. | 118/724 |
| 2002/0068458 A1 | 6/2002 | Chiang et al. | 438/694 |
| 2002/0073924 A1 | 6/2002 | Chiang et al. | 118/723 R |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0082296 A1 | 6/2002 | Verschoor et al. | 514/557 |
| 2002/0086106 A1 | 7/2002 | Park et al. | 427/248.1 |
| 2002/0092471 A1 | 7/2002 | Kang et al. | 118/715 |
| 2002/0094689 A1 | 7/2002 | Park | 438/694 |
| 2002/0098627 A1 | 7/2002 | Pomarede et al. | 438/149 |
| 2002/0104481 A1 | 8/2002 | Chiang et al. | 118/723 |
| 2002/0106536 A1 | 8/2002 | Lee et al. | 428/702 |
| 2002/0134307 A1 | 9/2002 | Choi | 118/715 |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al. | 427/248.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0197402 A1 | 12/2002 | Chiang et al. | 427/255.39 |
| 2003/0004723 A1 | 1/2003 | Chihara | 704/260 |
| 2003/0013320 A1 | 1/2003 | Kim et al. | 438/778 |
| 2003/0031807 A1 | 2/2003 | Elers et al. | 427/569 |
| 2003/0042630 A1 | 3/2003 | Babcoke et al. | 261/121.1 |
| 2003/0049942 A1 | 3/2003 | Haukka et al. | 438/778 |

| | | | |
|---|---|---|---|
| 2003/0072975 A1 | 4/2003 | Shero et al. | 428/704 |
| 2003/0075273 A1 | 4/2003 | Kilpela et al. | 156/345.33 |
| 2003/0075925 A1 | 4/2003 | Lindfors et al. | 285/367 |

FOREIGN PATENT DOCUMENTS

| | | | |
|---|---|---|---|
| JP | 4291916 | 9/1992 | C30B/25/16 |
| JP | 5047666 | 2/1993 | H01L/21/205 |
| JP | 5206036 | 8/1993 | H01L/21/205 |
| JP | 5234899 | 9/1993 | H01L/21/205 |
| JP | 5270997 | 10/1993 | C30B/29/68 |
| JP | 6224138 | 5/1994 | C30B/25/14 |
| JP | 200319772 | 3/2000 | C23C/16/00 |
| JP | 2001020075 | 11/2000 | C23C/16/44 |
| JP | 2001111000 | 4/2001 | H01L/27/105 |
| JP | 2001172767 | 6/2001 | C23C/16/40 |
| WO | WO 96/17107 | 6/1996 | C23C/16/44 |
| WO | WO 99/01595 | 1/1999 | C30B/25/14 |
| WO | WO 99/29924 | 6/1999 | C23C/16/04 |
| WO | WO 99/65064 | 12/1999 | H01L/21/00 |
| WO | WO 0016377 | 3/2000 | |
| WO | WO 00/54320 | 9/2000 | H01L/21/44 |
| WO | WO 00/79576 | 12/2000 | H01L/21/205 |
| WO | WO 01/15220 | 3/2001 | H01L/21/768 |
| WO | WO 01/17692 | 3/2001 | B05C/11/00 |
| WO | WO 01/27346 | 4/2001 | C23C/16/44 |
| WO | WO 01/27347 | 4/2001 | C23C/16/44 |
| WO | WO 01/29280 | 4/2001 | C23C/16/32 |
| WO | WO 01/29891 | 4/2001 | H01L/21/768 |
| WO | WO 01/29893 | 4/2001 | H01L/21/768 |
| WO | WO 01/36702 | 5/2001 | C23C/16/00 |
| WO | WO 01/66832 | 9/2001 | C30B/25/14 |
| WO | WO 02/08485 | 1/2002 | C23C/16/00 |
| WO | WO 02/08488 | 1/2002 | C23C/16/44 |
| WO | WO 02/43115 | 5/2002 | |
| WO | WO 02/45167 | 6/2002 | H01L/27/00 |

OTHER PUBLICATIONS

Parnisz, et al, Abstract of "Preparation of Solar–Grade Amorphous Silicon From Fluorinated Silanes", Solar Cells, vol. 21, pp. 195–203, Jun.–Aug. 1987.

Aral, et al., Abstract of "Role of SiH4 Gas Heating in the Growth of Hydrogenated Microcrystalline Silicon", Jpn J Appl Phys Part 2, vol. 35, No. 6A, pp. L676–L679, 1996.

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–5.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236–42.

Kukli, et al., "Properties of $Ta_2O_5$–Based Dielectric Nanolaminates Deposited by Atomic Layer Epitaxy," Journal of the Electrochemical Society, vol. 144, No. 1, Jan. 1997; p. 300–6.

Kukli, et al., "Properties of $(Nb_{1-x}Ta_x)_2O_5$ Solid Solutions and $(Nb_{1-x}Ta_x)_2O_5$–$ZrO_2$ Nanolaminates Grown by Atomic Layer Epitaxy," 1997; p. 785–93.

Ritala, M., et al., "Chemical Vapor Deposition," Jan. 1999, p. 6–9.

Rossnagel, et al. "Plasma–enhanced Atomic Layer Deposition of Ta and T1 for Interconnect Diffusion Barriers," J. Vac. Sci, Technol. B., vol. 18, No. 4 (Jul. 2000); p2016–20.

Niinisto, et al. "Synthesis of Oxide Thin Films and Overlayers by Atomic Layer Epitaxy for Advanced Applications," Materials Science and Engineering B41 (1996) 23–29.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001.

* cited by examiner

METHOD AND APPARATUS FOR GENERATING GAS TO A PROCESSING CHAMBER

BACKGROUND OF THE INVENTION

1. Field of the Invention

Embodiments of the invention generally relate to a method and apparatus for subliming a solid to provide a gas to a micromachining processing chamber.

2. Background of the Related Art

Semiconductor processing and micromachining use a wide variety of process gases. As structures and devices become increasingly complex, it would be advantageous to provide greater variety of process chemistries. However, some processes gases may be prohibitively expensive to refine, difficult to handle or suffer from other shortcomings such as highly reliable gas delivery techniques.

Process gases used during semiconductor processing and micromachining are typically provided to the gas panel in liquid or gaseous form from a central source or a supply vessel positioned proximate the gas panel. Some process gases may be generated at or near the gas panel from solid material through a sublimation process. Sublimation is generally the process through which a gas is produced directly from a solid at a certain pressure and temperature without passing through a liquid state. Some gases that may be produced through a sublimation process include xenon difluoride and nickel carbonyl, among others. As these materials tend to be very reactive and expensive, careful control of the sublimation process is required in order to manage the generation of sublimed process gases without undue waste.

A conventional sublimation process is typically performed in a heated vessel loaded or filled with the solid material to be sublimed. As gas is needed, the vessel walls and or tray supporting the solid material are heated and gas is produced. However, this method has a number of drawbacks.

Primarily, it is difficult to control heat transfer through the walls of the vessel. This results in inefficient consumption of the sublimed solids. The sublimation reaction driven by the heated walls of the vessel consumes the outer portions of the solids contained in the vessel. As many sublimed gases have a propensity to coagulate with the generating solid upon cooling, the solid coagulates at the center of the vessel, substantially reducing the surface area available for future sublimation.

Additionally, the temperature gradient within the vessel results in difficulty controlling the volume of sublimed process gas produced. Once a desired amount of process gas has been produced, residual heat of the vessel walls continues to undesirably drive the sublimation reaction, thereby producing an excess of process gas. The production of more gas than necessary drives up process costs and additionally requires frequent process interruption to recharge the crystals within the vessel. The residual gas also may attack the components within the gas delivery system.

Moreover, some sublimed gases, such as xenon difluoride, have a propensity to deposit on passages of the vessel and subliming crystals. Thus, prevention of excess process gas generation/formation prevents clogging of vessel passages. Additionally, preventing the subliming crystals from coagulating with re-deposited material maintains the surface area available for future sublimation, thus improving the gas generation uniformity over a larger process window.

Therefore, a need exists for an improved method and apparatus for providing sublimed gases to a processing chamber.

SUMMARY OF THE INVENTION

In one aspect of the invention, an apparatus for generating gas for a processing system is provided. In one embodiment, an apparatus for generating gas for a processing system includes an unitary, isolatable, transportable canister having a plurality of first spacing elements, a plurality of second spacing elements and a solid material disposed within the canister. The spacing elements have different mean diameters. The solid material is adapted to produce a gas vapor when exposed to a temperature above a predetermined level at a predetermined pressure.

In another embodiment, an apparatus for generating gas for a processing system includes a gas source coupled to a processing chamber by a first gas line. A canister is coupled in-line with the first gas line and contains a solid material that produces a process gas when heated. A heater is disposed between the gas source and the canister to heat gas flowing into the canister.

In another aspect of the invention, a method for generating gas for a processing chamber is provided. In one embodiment, a method for generating gas for a processing chamber includes heating a carrier gas flowing in a first gas line, flowing the heated carrier gas into a canister containing a solid material, and generating a process gas from the solid material by sublimation.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of the inventions and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE INVENTION

Figure 1:
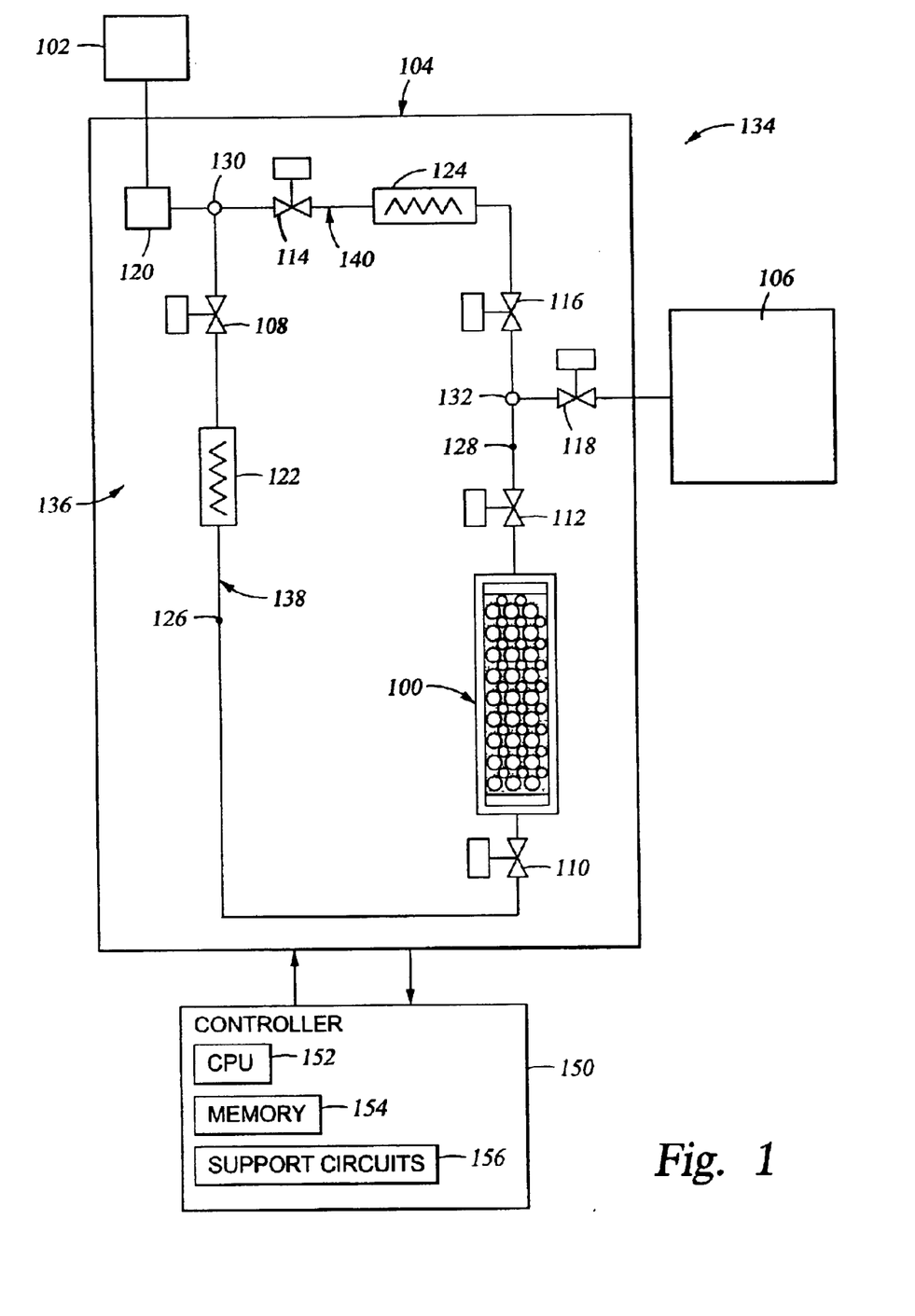
FIG. 1 is a simplified schematic view of a processing system having one embodiment of a gas generation system.

FIG. 1 generally depicts a simplified schematic of a processing system 134, which in one embodiment, is suitable for micromachining structures on silicon or other materials. The processing system 134 generally includes a processing chamber 106 coupled to a gas panel 104. The processing chamber may be any suitable processing chamber, for example, those available from Applied Materials, Inc. located in Santa Clara, Calif. Exemplary processing chambers include DPS CENTURA® etch chambers, PRODUCER® chemical vapor deposition chambers, DzX® chemical vapor deposition chambers and ENDURA® physical vapor deposition chambers, among others.

The gas panel 104 generally controls the rate and pressure at which various process and inert gases are delivered to the processing chamber. The number and types of process and other gases delivered to the processing chamber 106 are generally selected based on the process to be performed in the processing chamber 106 coupled thereto. For clarity, only a single gas delivery circuit 136 is depicted in the gas panel 104. However, multiple gas delivery circuits are contemplated.

The gas delivery circuit 136 is generally coupled between a carrier gas source 102 and the processing chamber 106. The carrier gas source 102 may be a local or remote vessel, or may be a centralized facility source that supplies the carrier gas throughout the facility. The carrier gas source 102 typically supplies a carrier gas such as argon, nitrogen, neon, helium or other inert or non-reactive gas.

The gas delivery circuit 136 typically includes a flow controller 120 disposed between the carrier gas source 102 and a first tee 130 that separates the gas delivery circuit 136 into the a gas generation line 138 and a bypass line 140. A second tee 132 rejoins the gas generation line 138 and the bypass line 140 before connecting to the processing chamber 106. The flow controller 120 may be a proportional valve, modulating valve, needle valve, regulator, mass flow controller or the like. One flow controller 120 that may be utilized is available from Sierra Instruments, Inc., located in Monterey, Calif.

The gas generation line 138 generally includes a first heater 122 and a sublimation or source canister 100 coupled in series. A first valve 108 is coupled between a first heater 122 and the first tee 130. A first sensor 126 or other means for measuring temperature is coupled to the gas generation line 136 between the first heater 122 and a second valve 110. The first sensor 126 is adapted to detect a metric indicative of a temperature of the carrier gas flowing through the gas generation line 138 into the canister 100. In one embodiment, the first sensor 126 is a thermocouple disposed against a conduit comprising the gas generation line 138. One sensor 126 that may be utilized is available from Davis Instruments, Inc., located in Baltimore, Md.

The source canister 100 is coupled between the second valve 110 and a third valve 112. In one embodiment, the second and third valves 110, 112 are coupled to the gas generation line 138 by disconnect fittings (not shown) to facilitate removal of the valves 110, 112 and canister 100 from the gas generation line 138 as a unitary assembly.

The second tee 132 is coupled between the third valve 112 and the processing chamber 106. The second tee 132 couples the output of the source canister 100 the bypass line 140 to the processing chamber 106. A second sensor 128 or other means for measuring temperature is coupled to the gas generation line 138 between the third valve 112 and the second tee 132. The second sensor 128 is adapted to detect a metric indicative of a temperature of the gases flowing out of the canister 100.

The bypass line 140 generally includes a fourth valve 114 coupled between a second heater 124 and the first tee 130. A fifth valve 116 is coupled between the second heater 124 and the second tee 132. A sixth valve 118 is generally coupled between the second tee 132 and the processing chamber 106 to selectively isolate the processing chamber 106 from the gas delivery circuit 136.

The first through sixth valves 108, 110, 112, 114, 116, 118 are typically shut off valves used to divert the flow of gases within the gas delivery circuit 136. The valves may also be used to selectively isolate the various components within the gas delivery circuit 136 to facilitate removal, replacement and/or service of the isolated component. The second, third, fifth and sixth valves 110, 112, 116, 118 are fabricated from materials compatible with the process and other gases handled by the gas delivery circuit 136. In one embodiment, the valves 110, 112, 116 and 118 may have valve bodies fabricated from stainless steel or nickel alloys and utilized KEL-F® or CHEMREZ® seals. The first and fourth valves 108, 114 are fabricated from materials compatible with the carrier gas. Typically, the valves are actuated in response to a signal from a controller 150 to coordinate the delivery of gases through the gas delivery circuit 136. Valves that may be utilized are available from Parker-Hannifin Corp., located in Cleveland, Ohio.

The first and second heaters 122, 124 may be any heating elements adapted to heat a flow of gas traveling in the gas production and bypass lines 138, 140. In one example, the heaters 122, 124 may be a block of material disposed proximate, against or circumscribing the gas production and bypass lines 138, 140 and having a cartridge heater or a heat transfer fluid flowing therethrough. In another, the heater 122, 124 may be a surface heater disposed against or proximate the conduits comprising the lines 138, 140, and are commercially available from many sources, including from Watlow Electric Manufacturing Company, located in St. Louis, Mo. The heater 122, 124 and/or gas production and bypass lines 138, 140 may be optionally insulated.

Figure 2:
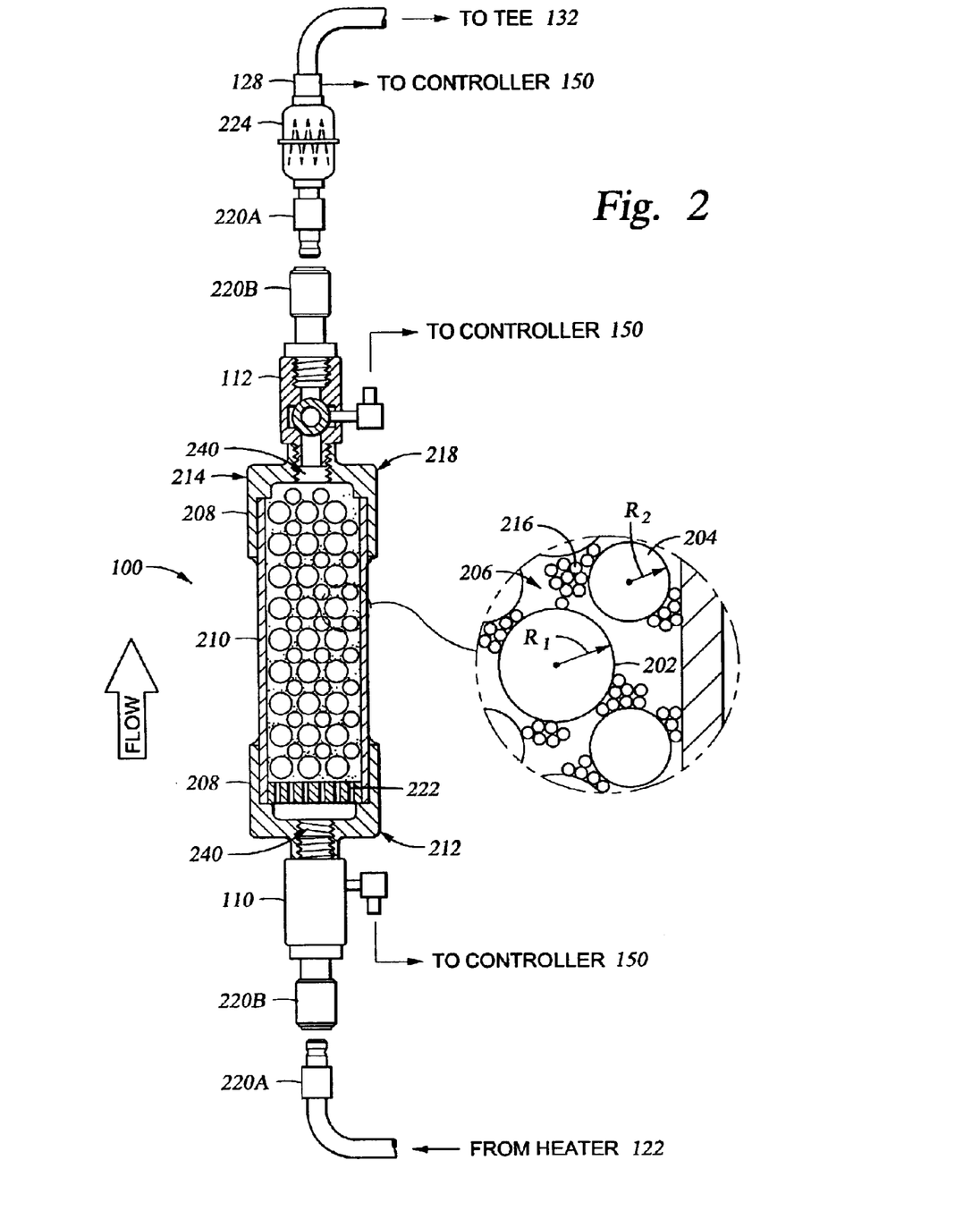
FIG. 2 is a sectional view of one embodiment of a sublimation canister.

FIG. 2 depicts a sectional view of the canister 100. The canister 100 generally includes a housing 218 that is adapted to hold precursor solids 216 from which a process (or other) gas may be generated through a sublimation process. The precursor solids 216 are typically any subliming solid with a non-linear vapor release curve. The precursor solids 216 with linear vapor release curves may also be used but have subliming reactions that are difficult to control. Some precursor solids 216 that may be utilized to generate process gas in the canister 100 through a sublimation process include xenon difluoride, nickel carbonyl, pentakis (dimethylamino) tantalum (PDMAT) and tungsten hexa-carbonyl, among others. The precursor solids 216 are typically in granular or powered form.

The housing 218 is generally fabricated from a material substantially inert to the solids 216 and gas produced therefrom, and thus, the material of construction may vary based on gas being produced. In one embodiment xenon difluoride is generated within the canister 100 and the housing 218 is fabricated from a material substantially inert to xenon difluoride, for example, stainless steel, aluminum, nickel, fluoropolymers, PTFE, PFA or other, suitable nonorganic material.

The housing 218 may have any number of geometric forms and may provide either a direct or labyrinth flow path for gases passing therethrough. In the embodiment depicted in FIG. 2, the housing 218 comprises a hollow body 210 that is generally packed with the plurality of first spacing elements 202 and the plurality of second spacing elements 204. The body 210 has a first end 212 and a second end 214 respectively sealed by end caps 208. The end caps 208 may be coupled to the body 210 by welding, bonding, adhesives or other leak-tight method. Alternatively, the body 210 and end cap 208 joint may have a seal, o-ring or gasket disposed therebetween to prevent leakage from the canister 100. The hollow body 210 may be a cylinder or alternatively comprise other hollow geometric forms, such as hollow square tubes, hexagonal tubes, regular and irregular polygonal tubes, and oval tubes, among other shapes.

Each end cap 208 includes a port 240 to allow gas flow into and out of the canister 100. The port 240 is generally sealable to allow the interior of the canister 100 to be isolated from the surrounding environment during removal of the canister 100 from the gas delivery circuit 136. In one embodiment, the second and third valves 110, 112 are sealingly coupled to each port 240 to prevent leakage from the canister 100 when removed from the gas generation line 138. Mating disconnect fittings 220A, 220B may be coupled to the valves 110, 112 to facilitate removal and replacement of the canister 100 to the gas generation line 138. The third valve 112 is typically a ball valve or other positive sealing valve that has an orifice sufficient to allow the canister 100 to be charged with the solids 116 therethrough without removal of the end caps 208. The canister 100 is typically agitated to allow the solids 216 to intersperse between the spacing elements 202, 204. This allows the canister 100 to be efficiently loaded and recycled while minimizing potential solid 216 or gas leakage from the canister 100 during filling, transport or coupling to the gas delivery circuit 136. In one embodiment, the third valve 112 has a ½ inch orifice.

A first filter 222 is disposed inside the canister 100 proximate a first end 212 to prevent the solids 216 from passing out of the first end 212 of the canister 100. A second filter 224 is coupled between the third valve 112 and the second tee 132 to prevent solids 216 from entering the processing system 106. The second filter 224 typically remains coupled to the gas delivery circuit 138 when the canister 100 is removed for replacement or refilling.

The filters 222, 224 are generally inert to the reactive solids 216 and gas subliming therefrom. The filters 222, 224 provide a resistance of flow that enhances flow uniformity of gas through the canister 100. The filters 222, 224 additionally prevent the solids 216 from escaping the canister 100. In one embodiment, the filters 222, 224 may be fabricated from fluoropolymers, PFA, PTFE, porous nickel and the like.

The plurality of first spacing elements 202 and the plurality of second spacing elements 204 filling the canister 100 have at least one different physical attribute, typically a difference in mean diameter or shape that allows the first spacing elements 202 and the second spacing elements 204 to define an interstitial space 206 therebetween. The interstitial space 206 provides a volume in which the reactive solid 216 partially fills, while the remaining interstitial space 206 is allocated for the flow of gas through the canister 100.

The first spacing elements 202 and the second spacing elements 204 may have any wide variety of shapes to provide spacing for the precursor solids 216. For examples, the spacing elements 202, 204 may be spherical, cylindrical, conical, ellipsoidal, regular or irregular polyhedrons, or other shapes or a combination thereof, and are configured with different mean diameters to provide a predetermined packing density within the interstitial space 206. The surface of the spacing elements 202, 204 may be smooth, roughened or patterned. Spacing elements 202, 204 that include a roughened surface have a greater surface are available for sublimed gases to condense upon. Thus, as the spacing elements 202, 204 become coated with condensed reactive solids 216, a large exposed surface area of reactive solids 216 is maintained to maximize the amount of reactive solids 216 available for future subsequent reactions. One embodiment may have spacing elements 202, 204 having the same shape but of different sizes, as well as different shapes of spacing elements 202, 204 in a variety of sizes, selected depending upon a number of parameters such as source solid characteristics, density, porosity, composition of the spacing elements, internal volume and shape of the canister, and the amount of process gas to be generated.

The material of the spacing elements 202, 204 is preferably one with low thermal conductivity and low heat capacity and allows for preferential re-deposition of the subliming solid 216 as compared to the other surfaces of the canister 100. Even with re-deposition, the arrangement of spacing elements 202, 204 maintains a large sublimation surface area required for consistent long-term use and uniform generation of sublimed gas from the solids 216. In one embodiment, the spacing elements 202, 204 are fabricated from stainless steel, aluminum, nickel, fluoropolymer, PTFE, PFA ceramic, silicon carbide or other, suitable non-organic material. Alternatively, the spacing elements 202, 204 may be coated with a stainless steel, aluminum, nickel, fluoropolymer, PTFE, PFA ceramic, silicon carbide or other, suitable non-organic material over a different core material. The sizes of the spacing elements 202, 204 are typically selected in relation to the crystal size of the source material 216.

In an embodiment adapted to sublime xenon difluoride, the first spacing elements 202 and the second spacing elements 204 are spheres and have a relationship that can be expressed by:

$$0.8 < R_2/R_1 < 0.95$$

where:

$R_1$ is a mean diameter of the first spacing element 202; and $R_2$ is a mean diameter of the second spacing element 204.

This relationship defines a predetermined packing density that advantageously provides sufficient surface area for uniform xenon difluoride sublimation using about 200 sccm of carrier gas at a temperature of at least about 20 degrees Celsius. In this configuration, there are large spaces between point contacts of the spacing elements 202, 204 that provide adequate volume for the subliming solid 216 to fill and a dispersed gas pass that ensures consistent sublimation. The spacing elements 202, 204 additionally present a large surface area for excess sublimed vapor to condense upon cooling, thus keeping a large surface area of precursor solids 216 consistently available for sublimation while preventing the coagulation of the entire subliming mass.

Figure 3:
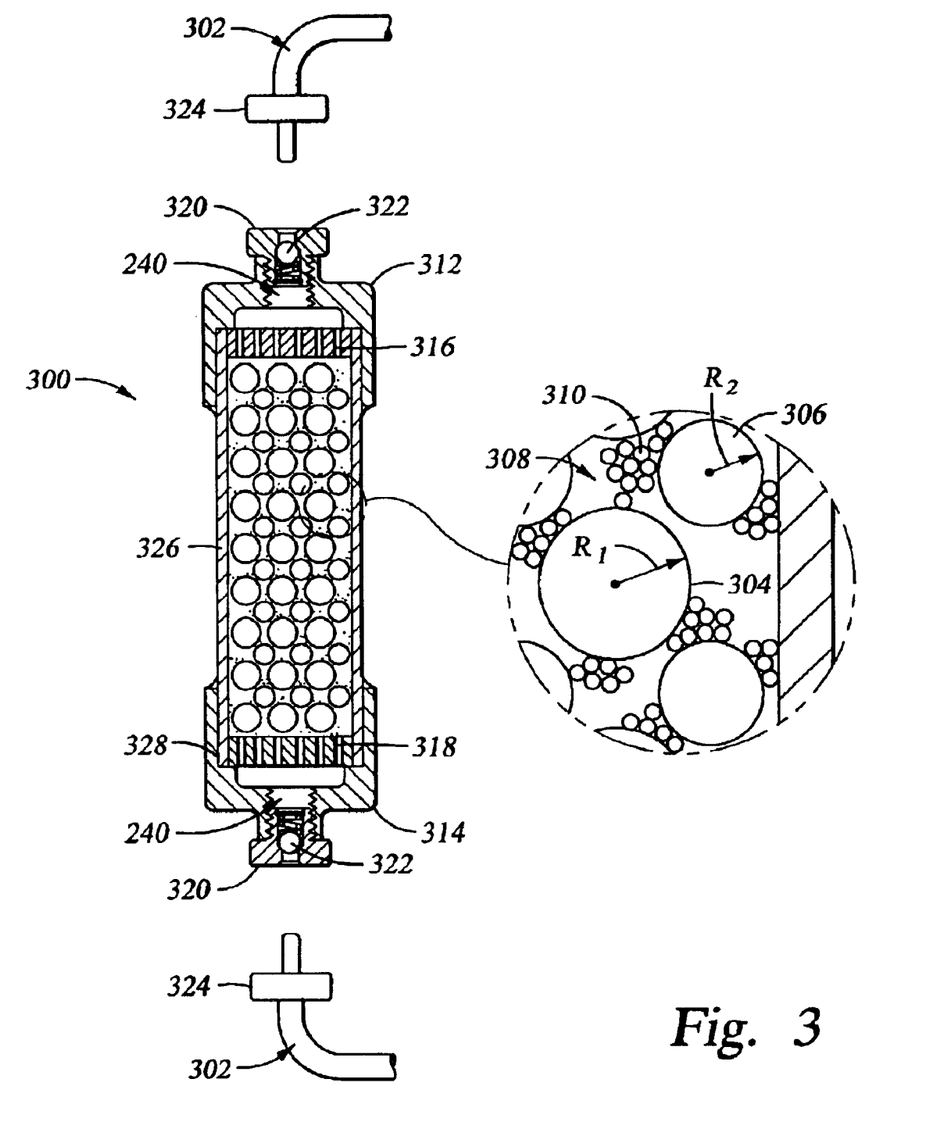
FIG. 3 is a sectional view of another embodiment of a sublimation canister.

FIG. 3 depicts another embodiment of a sublimation canister 300. The canister 300 is fabricated from a material compatible with the process chemistries. The canister 300 is packed with a plurality of first spacing elements 304 and a plurality of second spacing elements 306 defining an interstitial space 308 therebetween, in which sublimating precursor solids 310 are disposed. A first filter 316 and a second filter 318 are disposed within the canister 300 to contain the solids 310.

The canister 300 has a first end cap 312 and a second end cap 314. A gas-tight fitting 320 is typically coupled to each end cap 312, 314 and is adapted to allow disconnection of the canister 300 from a fluid line 302 while preventing leakage from the canister 300. In one embodiment, the fitting 320 includes an internal check valve 322 that prevents gas passage from the canister 300 until coupled with a mating fitting 324 of the fluid line 302.

The first end cap 312 is typically sealingly fastened to the canister 300 in a permanent manner. The second end cap 314 is removably coupled to the canister 300 to facilitate filling and/or re-filling of the canister 300. With the second end cap 314 removed, the canister 300 may be emptied of the old spacers along with any unused solids 310 and refilled with new spacers and fresh solids 310, either as a pre-made mixture, or mixed as poured into the canister 300.

In one embodiment, the second end cap 314 is threaded to a body 326 of the canister 300. A seal, for example, an o-ring 328, is disposed between the second end cap 314 and body 326 to prevent leakage from the canister 300 after the second end cap 314 is coupled to the canister 300. The second filter 318 is typically removable from the canister 300 to facilitate filling the canister 300 with solids 310.

Referring back to FIG. 1, the controller 150 is coupled to the gas panel 104 and process chamber 106 to control the generation and delivery of gas delivery, and processing of substrates (not shown) within the process chamber 106. In one embodiment, the controller 150 includes a central processing unit (CPU) 152, memory 154 and support circuits 156. The CPU 152 may be one of any form of computer processor that can be used in an industrial setting for controlling various chambers and subprocessors. The memory 154 is coupled to the CPU 152. The memory 154, or computer-readable medium, may be one or more of readily available memory such as random access memory (RAM), read only memory (ROM), floppy disk, hard disk, or any other form of digital storage, local or remote. The support circuits 156 are coupled to the CPU 152 for supporting the processor in a conventional manner. These circuits include cache, power supplies, clock circuits, input/output circuitry, subsystems, and the like.

Figure 4:
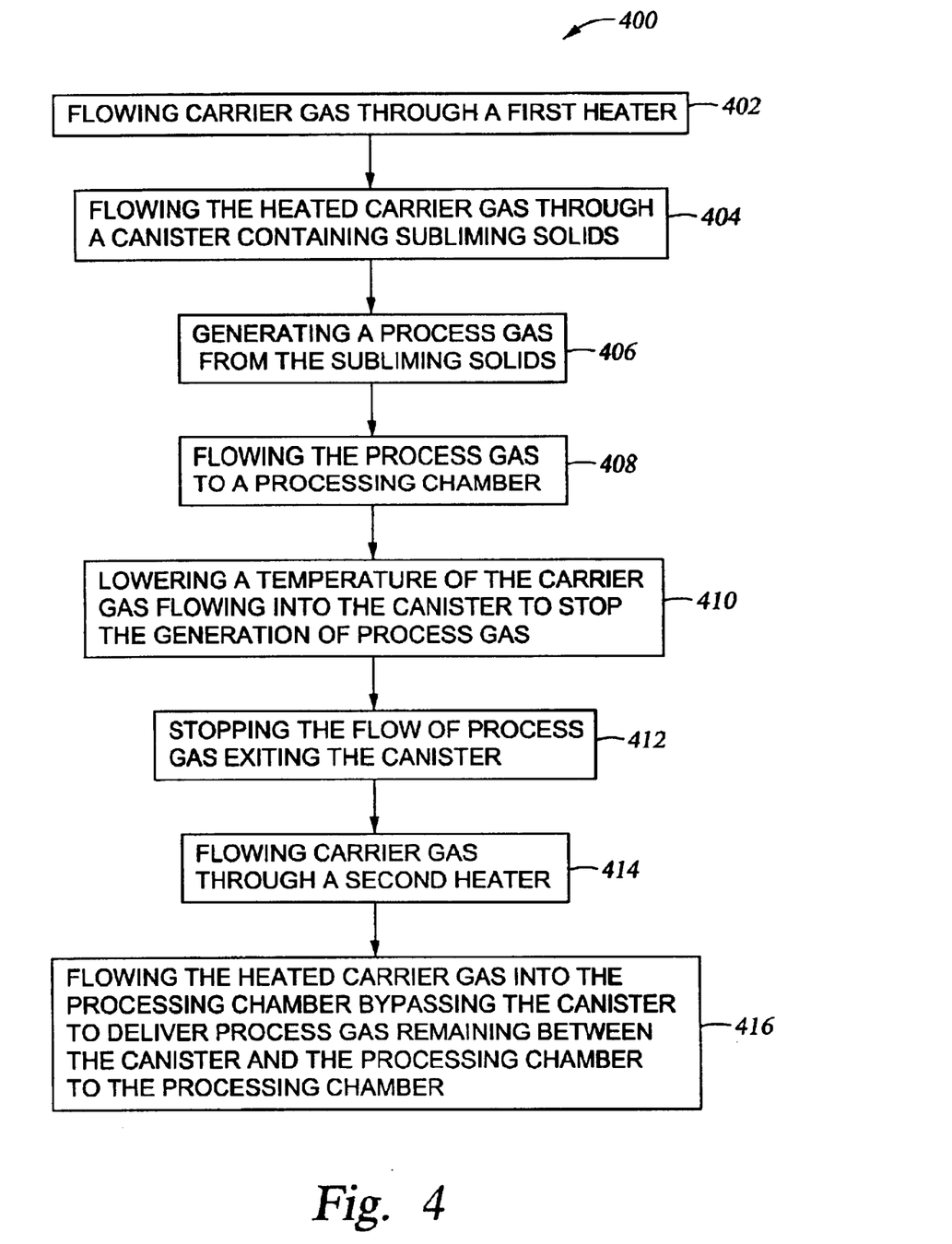
FIG. 4 is a flow diagram of one embodiment of a sublimation process.

A process, for example, a gas generation process 400 described below, is generally stored in the memory 154, typically as a software routine. The software routine may also be stored and/or executed by a second CPU (not shown) that is remotely located from the hardware being controlled by the CPU 152.

Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

FIG. 4 depicts a flow diagram of one embodiment of a method 400 for supplying gas to a processing chamber. One skilled in the art will appreciate that while one embodiment of the method 400 below describes xenon difluoride gas generation, other gases may be produced using the present invention such as pentakis (dimethylamino) tantalum, nickel carbonyl and tungsten hexa-carbonyl, among others.

The method 400 begins at step 402 by flowing a carrier gas through the gas delivery line 138 through the first heater 122. The temperature of the carrier gas is typically at, or slightly below room temperature when leaving the gas source 102. The flow controller 120 generally controls the rate at which the carrier gas is provided through the gas delivery circuit 136. The fourth valve 114 disposed at the entrance of the bypass line 140 is closed to ensure that all gas flowing through the gas delivery circuit 136 travels through the gas delivery line 138.

The heater 122 generally heats the carrier gas flowing through the gas delivery line 138 to a pre-determined temperature. In an embodiment that produces xenon difluoride gas, the heater 122 heats the carrier gas to about a temperature above about 20 degrees Celsius. For other subliming solids, the temperature may be selected utilizing a vaporization curve for a given pressure. The temperature of the gas leaving the first heater 122 is monitored by the first sensor 126. The first sensor 126 is coupled to the controller 150 to provide feedback to the heater 122 for accurate control of the carrier gas temperature. In one embodiment, the carrier gas is argon and provided at a rate of about 200 sccm and heated to greater than about 20 degrees Celsius.

Al step 404, the heated carrier gas is flowed through the canister 100 containing the subliming solids 216. The predetermined heat of the carrier gas drives a sublimation reaction, causing a process gas to vaporize directly from the subliming solids 216 at step 406. In one embodiment, xenon difluoride is produced. However, the process may be utilized with other gases that are readily sublimed from solid form.

At step 408, the process gas generated in the canister 100 flows through the third valve 112 to the tee 132 and into the processing chamber 106. The fifth valve 116 is typically closed to prevent process gas from entering the bypass line 140. Alternatively, the fifth valve 116 may be at least partially opened to dilute the flow of gases exiting the canister 100.

Once a pre-determined volume of process gas has been generated for delivery to the processing chamber 106, the first heater 122 is turned off to reduce the temperature of the carrier gas flowing into the canister 100. As the temperature of the carrier gas flowing into the canister is reduced, the sublimation reaction is stopped at step 410 thereby preventing excess process gas from being generated.

At step 412, the flow of process and/or carrier gas exiting the canister 100 is stopped. Typically, the third valve 112 is closed in response to the temperature of the gases leaving the canister 100 falling below a predefined temperature. Typically, this temperature is set at a point that prevents condensation of the process gas outside of the canister 100. Advantageously, the excess process gas remaining in the canister 100 condenses on the spacing elements 202, 204 thus maintaining a large surface area of precursor solids 216 available for the next sublimation reaction.

At step 414, the flow of carrier gas is diverted from the gas generation line 138 to the bypass line 140 by closing the first valve 108 and opening the fourth valve 114. The second heater 124 heats the carrier gas passing through the bypass line 140. Alternatively as described above, a portion of the carrier gas may be diverted through the bypass line 140 and mix this the gases exiting the canister 100 to control a dilution of the ratio of carrier to process gas that is delivered to the processing chamber 106. At step 416, the heated carrier gas flowing from the bypass line 140 delivers the remaining process gas between the canister 100 and the processing chamber 106 into the processing chamber 106 while avoiding condensation of the process gas within the gas delivery circuit 136.

Figure 5:
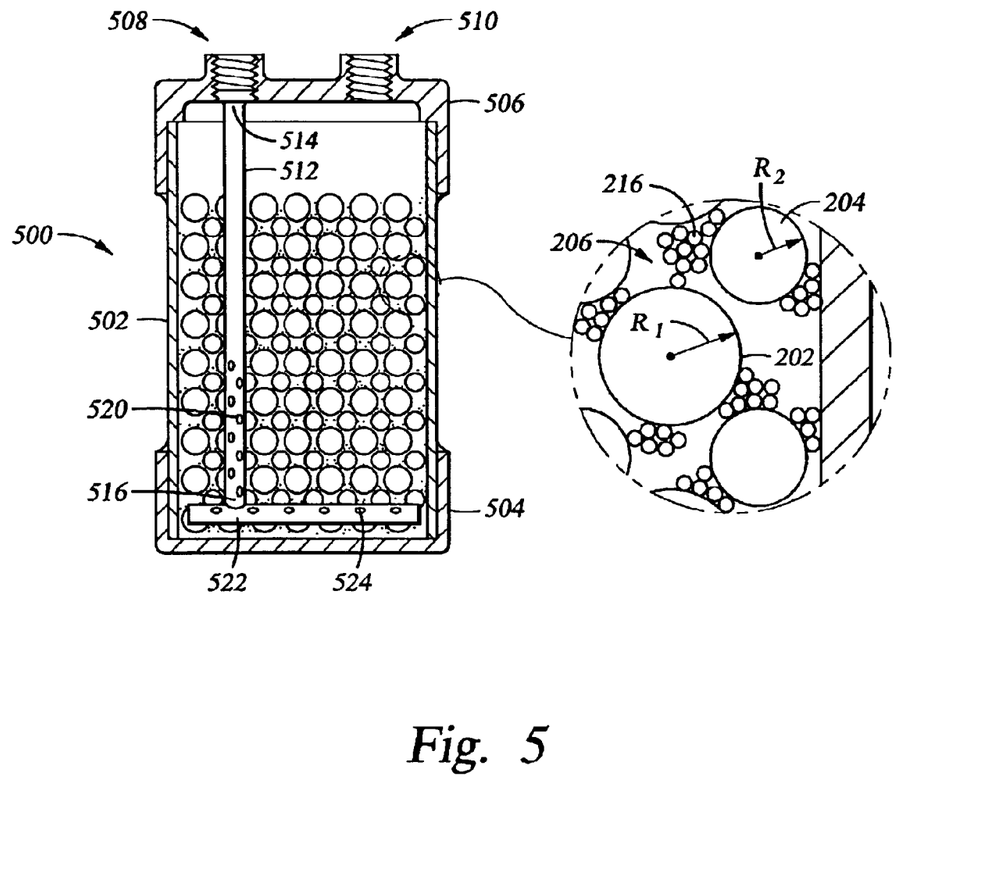
FIG. 5 is another embodiment of a sublimation canister.

Another embodiment of a sublimation canister 500 is depicted in FIG. 5 that may be utilized in the processing system 134 of FIG. 1. In this embodiment, the canister 500 is an ampoule having a body 502, a bottom 504, and an end cap 506. The body 502 and the bottom 504 may be comprised of a single piece of material or they may be separate components welded or otherwise sealingly fastened together. End cap 506 may be threaded and removable from body 502 as described in FIG. 3, or it may be sealingly fastened to the body 502 as described in FIG. 2. End cap 506 also contains a first port 508 and a second port 510 to allow for the flow of a gas into and out of canister 500.

The canister 500 is packed with a plurality of first spacing elements 202 and a plurality of second spacing elements 204 defining an interstitial space 206 therebetween, in which sublimating solids 216 are disposed. Canister 500 can be filled or re-filled with sublimating solids 216 by removing the end cap 506 or through port 510, if end cap 506 is sealingly fastened to canister body 502. Optionally, a filter (not shown) may be disposed within the canister 500 to contain the solids 216 as described in FIG. 3, or supplied outside the canister 500 as described in FIG. 2, to prevent any solids 216 or particles generated therefrom from entering the processing system 106.

In one embodiment, a tube 512 having a first end 514 and a second end 516 is disposed within the canister 500. The tube 512 is coupled at the first end 514 to the first port 508 and is of such a length that the second, end 516 of the tube 512 is disposed among the spacing elements 202, 204.

Optionally, the second end 516 of the tube 512 may be adapted to diffuse the carrier gas flowing out of the tube 512 into the canister 500. The second end 516 may include a plurality of holes 520 formed therethrough to allow the carrier gas to flow into the canister 500 over a wide area. Alternatively or in addition to the holes 520, a diffuser plate 522 may be coupled to the second end 514 of the tube 512. The diffuser plate 522 includes a plurality of apertures 524 adapted to spread the carrier gas along the bottom of the canister 500 thereby driving the sublimation reaction over a larger area of the canister 500 for consistent gas sublimation and efficient consumption of precursor solids 216.

Therefore, a method and apparatus for generating a process gas via a sublimation process for a semiconductor processing chamber is provided. It is to be appreciated that the sublimation and delivery methods of the present invention may be used in semiconductor, micromachining, MEMS, optics and other processing chambers that would benefit from reliable generation of process gas or gases using the sublimation methods and advantageous apparatus described herein. A thermally controlled carrier gas is used to drive a subliming reaction that produces a processing gas. The rapid response of the subliming reaction to the temperature of the carrier gas allows for rapid production and stoppage of processing gas production, providing subliming material conservation and faster system response times. Moreover, a canister that holds the subliming material is modular and isolatable, thus facilitating rapid replacement during use to limit system downtime while providing a transportable vessel that may be recharged with new subliming material for future use.

While the foregoing is directed to the preferred embodiment of the present invention, other and further embodiments of the invention may be devised without departing from the basic scope thereof. The scope of the invention is determined by the claims that follow.

What is claimed is:

1. An apparatus for generating gas for a processing system, comprising:

a modular, isolatable, transportable canister adapted for use in a gas panel of a processing system;

a plurality of first spacing elements disposed within the canister;

a plurality of second spacing elements disposed within the canister and defining an interstitial space with the first spacing elements, the second spacing elements distinctly different and separately identifiable from the first spacing elements; and a solid precursor material at least partially filling the interstitial space.

2. The apparatus of claim 1, wherein the first and second spacing elements have different mean diameters.

3. The apparatus of claim 1, wherein a relationship between the first spacing elements and the second spacing elements is expressed by:

$$0.8 < R_2/R_1 < 0.95$$

where:

$R_1$ is a mean diameter of the first spacing element; and $R_2$ is a mean diameter of the second spacing element.

4. The apparatus of claim 1, wherein at least one of the first spacing elements or the second spacing elements is a sphere or polyhedron.

5. The apparatus of claim 1, wherein the solid precursor material is selected from a group consisting of xenon difluoride, pentakis (dimethylamino) tantalum, nickel carbonyl and tungsten hexa-carbonyl.

6. The apparatus of claim 1, wherein at least one of the spacing elements is fabricated or coated with a material selected from a group consisting of stainless steel, aluminum, nickel, fluoropolymer, PTFE, PFA ceramic and silicon carbide.

7. The apparatus of claim 1, wherein at least one of the spacing elements is fabricated or coated with a non-organic material.

8. The apparatus of claim 1, wherein the first spacing elements have a rough or patterned surface.

9. An apparatus for generating gas for a processing system, comprising:

a hollow body;

a gas inlet formed in the hollow body;

a tube disposed in the hollow body and coupled to the gas inlet a gas outlet formed in the hollow body;

a plurality of first spacing elements disposed within the hollow body;

a plurality of second spacing elements disposed within the hollow body and defining an interstitial space with the first spacing elements, the second spacing elements distinctly different and separately identifiable from the first spacing elements; and a solid precursor material at least partially filling the interstitial space.

10. The apparatus of claim 9, wherein a relationship between the first spacing elements and the second spacing elements is expressed by:

$$0.8 < R_1/R_2 < 0.95$$

where:

$R_1$ is a mean diameter of the first spacing element; and $R_2$ is a mean diameter of the second spacing element.

11. The apparatus of claim 9, wherein at least one of the first spacing elements or the second spacing elements is a sphere or polyhedron.

12. The apparatus of claim 9, wherein at least one of the spacing elements is fabricated or coated with a material selected from a group consisting of stainless steel, aluminum, nickel, fluoropolymer, PTFE, PFA ceramic and silicon carbide.

13. The apparatus of claim 9, wherein at least one of the spacing elements is fabricated or coated with a non-organic material.

14. The apparatus of claim 9, wherein the first spacing elements have a rough or patterned surface.

15. The apparatus of claim 9, wherein the tube further comprises:

a plurality of holes formed therethrough.

16. The apparatus of claim 9 further comprising a plate coupled to the tube opposite the inlet, the plate adapted to outwardly distribute gases flowing from the tube.

17. The apparatus of claim 9, wherein the solid precursor material is selected from a group consisting of xenon difluoride, pentakis (dimethylamino) tantalum, nickel carbonyl and tungsten hexa-carbonyl.

18. Apparatus for generating gas for a processing system, comprising:

a carrier gas source;

a processing chamber;

a first gas line coupled between the processing chamber and the carrier gas source;

a canister coupled in-line with the first gas line;

a solid precursor material disposed within the canister and adapted to produce a process gas via a sublimation process; and a first heater disposed upstream of the canister and adapted to heat the carrier gas flowing into the canister to at least about a predetermined level.

19. The apparatus of claim 18 further comprising:

a bypass line coupling the carrier gas source and processing chamber in parallel to the first heater and the canister.

20. The apparatus of claim 19, wherein the bypass line further comprises:

a second heater adapted to heat the carrier gas flowing through the bypass line.

21. The apparatus of claim 20 further comprising:

a first sensor coupled between the first heater and the canister, and adapted to provide a metric of carrier gas temperature; and a second sensor coupled between the canister and the processing chamber, and adapted to provide a metric of temperature of gases exiting the canister.

22. The apparatus of claim 21 further comprising:

a filter disposed between the solids contained in the canister and the processing chamber.

23. The apparatus of claim 18, wherein the canister further comprises:

a plurality of first spacing elements disposed within the canister; and a plurality of second spacing elements disposed within the canister and distinctly different and separately identifiable from the first spacing elements.

24. The apparatus of claim 23, wherein a relationship between the first spacing elements and the second spacing elements is expressed by:

$$0.8 < R_2/R_1 < 0.95$$

where:

$R_1$ is a mean diameter of the first spacing element; and $R_2$ is a mean diameter of the second spacing element.

25. The apparatus of claim 23, wherein at least one of the first spacing elements or the second spacing elements is a sphere or regular polyhedron.

26. The apparatus of claim 18, wherein the solid precursor material is selected from a group consisting of xenon difluoride, pentakis (dimethylamino) tantalum, nickel carbonyl and tungsten hexa-carbonyl.

27. Apparatus for generating gas for a processing system, comprising:

a carrier gas source;

a processing chamber;

a first gas line coupled between the processing chamber and the carrier gas source;

a second gas line coupled in parallel to the first gas line between the processing chamber and the carrier gas source;

a canister coupled in-line with the first gas line;

a plurality of first spacing elements disposed within the canister;

a plurality of second spacing elements disposed within the canister, the second spacing elements, larger, distinct different and separately identifiable from the first spacing elements;

a solid precursor material disposed within the canister and adapted to produce a gas vapor when exposed to a temperature above a predetermined level;

a first heater disposed between the canister and carrier gas source, and adapted to heat the carrier gas flowing into the canister to at least about the predetermined level;

a second heater adapted to heat carrier gas flowing in the second gas line; and a means for diverting gas between the first gas line and the second gas line.

28. The apparatus of claim 21, wherein the means for diverting the carrier gas flow is one or more valves.

29. The apparatus of claim 27, wherein a relationship between the first spacing elements and the second spacing elements is expressed by:

$$0.8 < R_2/R_1 < 0.95$$

where:

$R_1$ is a mean diameter of the first spacing element; and $R_2$ is a mean diameter of the second spacing element.

30. The apparatus of claim 27 further comprising a filter disposed between the solids and the processing chamber.

31. Apparatus for generating gas for a processing system, comprising:

a container adapted for use in a gas panel of a processing system;

a lid coupled to the container, the lid having a first port and a second port;

a plurality of first spacing elements disposed within the canister;

a plurality of second spacing elements disposed within the canister and defining an interstitial space with the first spacing elements, the first and second spacing elements having different mean diameters;

the second spacing elements distinctly different and separately identifiable from the first spacing elements; and a solid precursor material at least partially filling the interstitial space and adapted to produce a gas vapor when exposed to a temperature above a predetermined level at a predetermined pressure.

32. The apparatus of claim 31, wherein a relationship between the first spacing elements and the second spacing elements is expressed by:

$$0.8 < R_2/R_1 < 0.95$$

where:

$R_1$ is a mean diameter of the first spacing element; and $R_2$ is a mean diameter of the second spacing element.

33. The apparatus of claim 31, wherein at least one of the first spacing elements or the second spacing elements is a sphere or regular polyhedron.

34. The apparatus of claim 31, wherein the solid precursor material is selected from a group consisting of xenon difluoride, pentakis (dimethylamino) tantalum, nickel carbonyl and tungsten hexa-carbonyl.

35. The apparatus of claim 31, further comprising:
a tube having first and second ends, wherein the tube is coupled at the fist end to the first port and the length of the tube is such that the second end is disposed within the first and second spacing elements.

36. The apparatus of claim 31, wherein at least one of the spacing elements is fabricated or coated with a material selected from a group consisting of stainless steel, aluminum, nickel, fluoropolymer, PTFE, PFA ceramic and silicon carbide.

37. The apparatus of claim 31, wherein at least one of the spacing elements is fabricated or coated with a non-organic material.

38. The apparatus of claim 31, wherein the first spacing elements have a rough or patterned surface.

39. A method for generating gas for a semiconductor processing chamber, comprising:
heating a carrier gas flowing in a first gas line;
flowing the heated carrier gas into a canister containing a solid precursor material; and
generating a process gas from the solid precursor material by sublimation.

40. The method of claim 39 further comprising:
reducing the temperature of the gas flowing through the canister after a predetermined volume of process gas has been generated; and
preventing process gas from exiting the canister.

41. The method of claim 40 further comprising:
heating gas flowing through a second gas line, the second gas line teed to the first gas line between the canister and the processing chamber; and
sweeping residual process gas between the tee and processing chamber with the heated gas flowing through the second gas line.

42. The method of claim 40 further comprising:
sensing temperatures of gases flowing into and out of the canister.

43. The method of claim 39, wherein the solid precursor material being sublimed is a material selected from the group consisting of xenon difluoride, pentakis (dimethylamino) tantalum, nickel carbonyl and tungsten hexa-carbonyl.

44. The method of claim 39, wherein the step of flowing heated carrier gas into the canister further comprises:
flowing gas between a plurality of first spacing elements and a plurality of second spacing elements, wherein the second spacing elements are distinctly different and separately identifiable from the first spacing elements and a relationship between the first spacing elements and the second spacing elements is expressed by:

$$0.8 < R_2/R_1 < 0.95$$

where:

$R_1$ is a mean diameter of the first spacing element; and $R_2$ is a mean diameter of the second spacing element.

45. A method for generating gas for a semiconductor processing chamber, comprising:
heating gas flowing through a first gas line;
flowing the heated gas through a canister to sublime a process gas from a solid precursor material contained in the canister;
reducing the temperature of the gas flowing through the canister to limit process gas generation;
closing a valve disposed between the canister and processing chamber to prevent process gas from exiting the canister;
heating gas flowing through a second gas line, the second gas line teed to the first gas line between the valve and the processing chamber; and
purging residual process gas between the tee and processing chamber with the heated gas from the second gas line.

46. A method for generating gas for a processing chamber, comprising:
flowing a carrier gas through an interstitial space defined between a plurality of first spacing elements and a plurality of second spacing elements disposed in a canister, the second spacing elements distinctly different and separately identifiable from the first spacing elements; and
generating a process gas from a solid precursor material disposed in the interstitial space by sublimation.

47. The method of claim 46 further comprising:
heating the carrier gas prior to entering the canister.

48. The method of claim 47 further comprising:
reducing the temperature of the gas flowing through the canister after a predetermined volume of process gas has been generated.

49. The method of claim 48 further comprising:
preventing process gas from exiting the canister.

50. The method of claim 48 further comprising:
condensing the process gas on the first spacing elements and the second spacing elements.

51. The method of claim 48 further comprising:
heating gas flowing through a second gas line, the second gas line teed to the first gas line between the canister and the processing chamber; and
sweeping residual process gas between the tee and processing chamber with the heated gas flowing through the second gas line.

52. The method of claim 47 further comprising:
sensing temperatures of gases flowing into and out of the canister; and
adjusting the temperature of the gases in response to the sensed temperature.

53. The method of claim 46, wherein the solid precursor material being sublimed is a material selected from the group consisting of xenon difluoride, pentakis (dimethylamino) tantalum, nickel carbonyl and tungsten hexa-carbonyl.

54. The method of claim 46, wherein a relationship between the first spacing elements and the second spacing elements is expressed by:

$$0.8 < R_2/R_1 < 0.95$$

where:
  $R_1$ is a mean diameter of the first spacing element; and
  $R_2$ is a mean diameter of the second spacing element.

55. A method for charging a gas generation canister, the method comprising:
  dispensing a solid precursor material between a plurality of first spacing elements and a plurality of second spacing elements disposed in a canister, the second spacing elements distinctly different and separately identifiable from the first spacing elements; and
  sealing the canister to prevent leakage of gas therefrom.

56. The method of claim 55, wherein the step of dispensing the solid precursor material further comprises:
  opening a valve coupled to canister as a unit and passing the solid precursor material therethrough.

57. The method of claim 56, wherein the step of sealing the canister comprises:
  closing the valve.

58. The method of claim 55, wherein the step of dispensing the solid precursor material further comprises:
  agitating the canister.

59. The method of claim 55, wherein the step of dispensing the solid precursor material recharges the canister with precursor material.

60. The method of claim 55, wherein a relationship between the first spacing elements and the second spacing elements is expressed by:

$$0.8 < R_2/R_1 < 0.95$$

where:
  $R_1$ is a mean diameter of the first spacing element; and
  $R_2$ is a mean diameter of the second spacing element.

61. The method of claim 55, wherein the solid precursor material being sublimed is a material selected from the group consisting of xenon difluoride, pentakis (dimethylamino) tantalum (PDMAT), nickel carbonyl and tungsten hexa-carbonyl.

62. A method for charging a gas generation canister, the method comprising:
  intermixing a solid precursor material with a plurality of first spacing elements and a plurality of second spacing elements, the second spacing elements distinctly different and separately identifiable from the first spacing elements;
  disposing the intermixed spacing elements and precursor material into a canister; and
  sealing the canister to prevent leakage of gas therefrom.

63. The method of claim 62, wherein the solid precursor material being sublimed is a material selected from the group consisting of xenon difluoride, pentakis (dimethylamino) tantalum, nickel carbonyl and tungsten hexa-carbonyl.

* * * * *

UNITED STATES PATENT AND TRADEMARK OFFICE
CERTIFICATE OF CORRECTION

PATENT NO. : 6,915,592 B2
DATED : July 12, 2005
INVENTOR(S) : Rolf A. Guenther

It is certified that error appears in the above-identified patent and that said Letters Patent is hereby corrected as shown below:

Column 8,
Line 5, change "Al" to -- At --.

Column 9,
Line 10, remove the comma after "second".

Column 12,
Line 14, change "distinct" to -- distinctly --.

Column 13,
Line 19, change "fist" to -- first --.

Signed and Sealed this

Eighteenth Day of April, 2006

JON W. DUDAS
*Director of the United States Patent and Trademark Office*